US 6,683,816 B2

(12) United States Patent
Emmot et al.

(10) Patent No.: US 6,683,816 B2
(45) Date of Patent: Jan. 27, 2004

(54) ACCESS CONTROL SYSTEM FOR MULTI-BANKED DRAM MEMORY

(75) Inventors: Darel N Emmot, Ft. Collins, CO (US); Bryan G Prouty, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 66 days.

(21) Appl. No.: 09/972,408

(22) Filed: Oct. 5, 2001

(65) Prior Publication Data

US 2003/0067832 A1 Apr. 10, 2003

(51) Int. Cl.[7] ................................................. G11C 8/00
(52) U.S. Cl. ............................ 365/230.03; 365/230.06; 365/233
(58) Field of Search ....................... 365/230.03, 230.06, 365/230.08, 233, 189.02, 203, 189.04, 222; 711/5, 154, 158

(56) References Cited

U.S. PATENT DOCUMENTS

| | | | | |
|---|---|---|---|---|
| 5,469,558 A | * | 11/1995 | Lieberman et al. ......... 710/105 |
| 5,768,560 A | * | 6/1998 | Lieberman et al. ......... 711/167 |
| 5,940,342 A | * | 8/1999 | Yamazaki et al. ...... 365/230.03 |
| 5,959,929 A | * | 9/1999 | Cowles et al. ......... 365/230.03 |
| 6,049,502 A | * | 4/2000 | Cowles et al. ......... 365/230.03 |
| 6,192,446 B1 | * | 2/2001 | Mullarkey et al. .......... 711/105 |
| 6,233,195 B1 | * | 5/2001 | Yamazaki et al. ...... 365/230.03 |
| 6,262,938 B1 | * | 7/2001 | Lee et al. .................... 365/233 |
| 6,470,433 B1 | * | 10/2002 | Prouty et al. ................ 711/168 |

* cited by examiner

Primary Examiner—Gene Auduong
(74) Attorney, Agent, or Firm—Kevin M. Hart (57) ABSTRACT

A method and apparatus for controlling access to a multi-bank memory system. Multiple bank/row activation requests are presented by processes or systems seeking access to the memory. One of the banks of the memory is selected to be the target of a next bank/row activation request. Then, one of the requests corresponding to the chosen bank is selected and issued as the next request. Requests may be conditionally and iteratively selected until one is found whose target row corresponds to a currently active row in the target bank.

40 Claims, 6 Drawing Sheets

ACCESS CONTROL SYSTEM FOR MULTI-BANKED DRAM MEMORY

FIELD OF THE INVENTION

This invention relates generally to the control of memory systems. More specifically, the invention relates to controlling access to banked dynamic random access memory (DRAM) systems.

BACKGROUND

Banked DRAM Memory Systems. A particular row in a DRAM is commonly referred to as a "page" of memory. Generally speaking, an individual memory location may be specified using a row address and a column address. In older DRAM systems, only one page could be active at any given time. It was soon realized that multiple DRAM chips could be organized into "banks" so that more than one page could be active at a time—one active page per bank. It is now common to organize the pages of a single DRAM memory device into several banks internally. Multi-bank memory systems may also be formed using chips that have multiple banks internally. In any of these kinds of multiple-bank systems, a bank address is needed in addition to a row address and column address to specify a single memory location.

Bank/Row Activation Dead Time. Prior to accessing a target memory location in any multi-bank DRAM system, the corresponding page must first be activated. In other words, the bank/row combination in which the target memory location resides must be activated. After the bank/row activation step has been completed, efficiency may be achieved by performing multiple accesses on columns within the activated bank/row. Even more efficiency may be achieved if the multiple accesses are performed using "burst" commands, which are specifically designed to access sequential columns within a single bank/row. Prior to activating and accessing a different row within the same bank, the previously-accessed bank must be precharged. The precharge step is commonly referred to as "closing" a bank/row within the DRAM.

Each time an activate or precharge command is executed on a given bank, a certain amount of dead time is encountered before memory accesses can be performed on that bank. For example, after a bank/row activate command is issued to the DRAM chip, the memory controller must wait a predetermined minimum time prior to issuing reads or writes to column addresses within the activated bank/row. Similarly, the memory controller must wait a predetermined minimum time after issuing a precharge command to a bank before issuing an activate command to the same bank. The dead time that results from performing bank/row activates and precharges on the DRAM can dramatically affect the bandwidth that is available for executing memory accesses. For this reason, one of the concerns in memory controller design is to determine when precharge commands should be issued to the DRAM.

SUMMARY OF THE INVENTION

In one aspect, the invention includes a method and apparatus for controlling access to a multi-bank DRAM memory system. Multiple unexecuted bank/row activation requests are presented simultaneously by various processes or systems seeking access to the memory system. According to first criteria, one of the banks of the memory system is selected to be the target of a next bank/row activation request. According to second criteria, one of the unexecuted bank/row activation requests corresponding to the chosen bank is selected and issued as the next bank/row activation request.

In another aspect, the first criteria may include selecting the most recently used bank if to do so will likely result in the next bank/row activation request being processed before a precharge command is issued in relation to an immediately preceding bank/row activation request. In this manner, a precharge/activate pair may be eliminated from the command stream, thus conserving memory access bandwidth. Otherwise, the first criteria may include selecting the least recently used bank that corresponds to one of the unexecuted bank/row activation requests. Such a selection maximizes the opportunity to issue precharge and activate commands to the newly selected bank while burst activity is occurring in a previously-selected bank, again conserving memory access bandwidth.

In another aspect, the second criteria may include selecting a bank/row activation request whose target row is the same as a currently active row in the request's target bank. In this manner, a precharge/activate pair may be eliminated from the command stream, thus conserving memory access bandwidth. Otherwise, the second criteria may include selecting a bank/row activation request according to a predetermined ranking of the sources that generate the requests.

In another aspect, the invention includes iteratively and conditionally selecting unexecuted bank/row activation requests until a request is found whose target row is the same as a currently active row in the request's target bank. The iterative nature of the selection process, performed over several clock states, allows for the possibility of new and superior candidates for selection becoming available during the selection procedure. It also allows a single comparator to be used during the comparison and selection process.

In another aspect, the invention includes apparatus for controlling access to a DRAM memory system having multiple banks. The apparatus may include a multiplexer having its data inputs coupled to unexecuted bank/row activation requests; a bank selection system operable to choose one of the multiple banks of the memory system to be the target of a next bank/row activation request; and a stream selection system operable to choose one of the unexecuted bank/row activation requests corresponding to the chosen bank and to select the chosen request at the output of the multiplexer.

In another aspect, an apparatus for controlling access to a DRAM memory system having multiple banks may include storage logic operable to store plural unexecuted bank/row activation requests; and selection logic having at least one input coupled to the storage logic and having an output for presenting bank/row activation requests for execution. The selection logic may be operable: to conditionally choose a first one of the stored plural requests for possible execution; to determine whether the first conditionally chosen request meets certain criteria; and if so, to present the first conditionally chosen request for execution; but if not, to conditionally choose a second one of the stored plural requests for possible execution.

In still another aspect, the invention includes program code for causing a computer to control access to a multi-bank memory system in accordance with the above-described methods and apparatus.

DETAILED DESCRIPTION OF THE PREFERRED EMBODIMENTS

Figure 1:
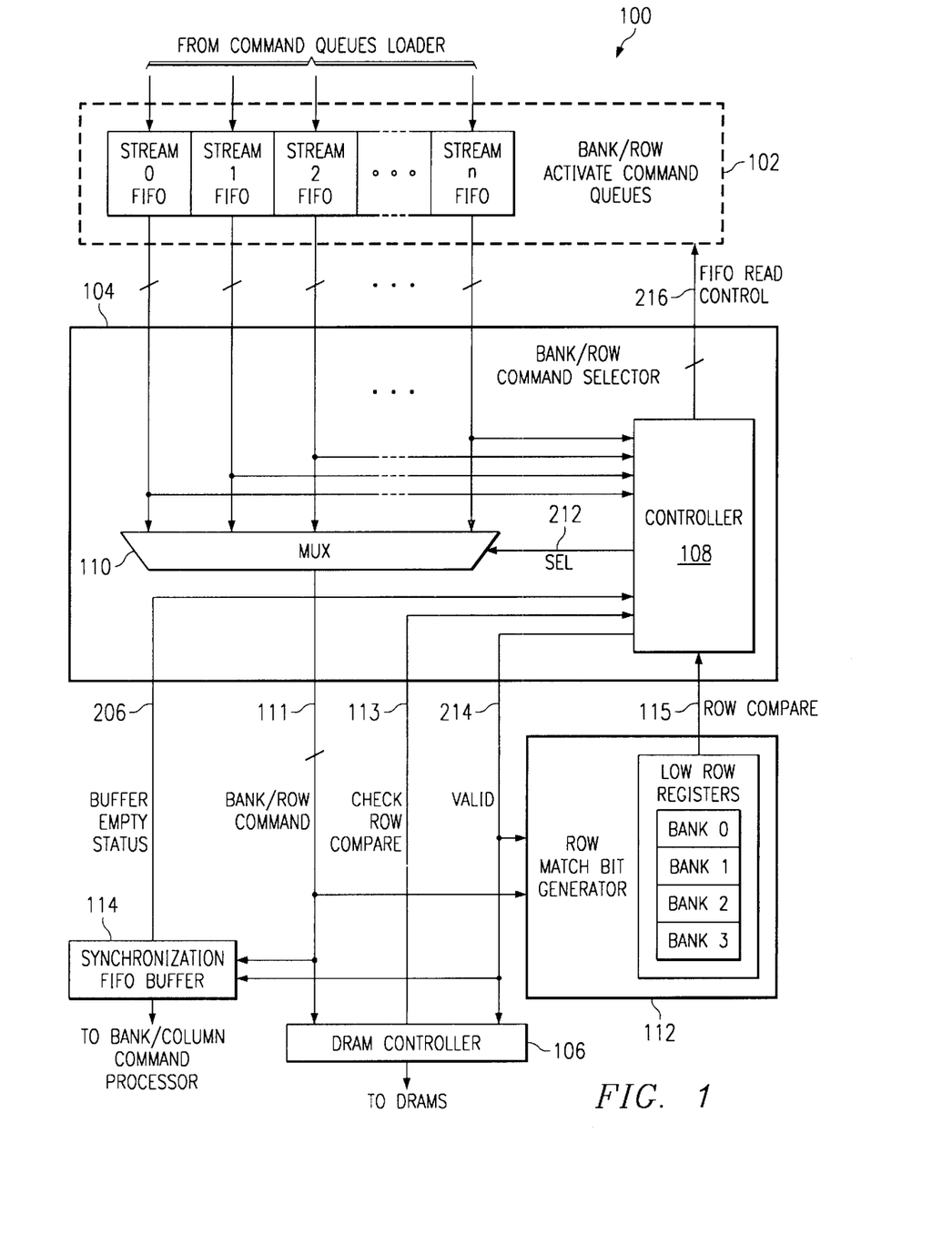
FIG. 1 is a block diagram illustrating a system according to a preferred embodiment of the invention for controlling access to a multi-bank memory system.

FIG. 1 illustrates a memory access control system 100 according to a preferred embodiment of the invention. Unexecuted bank/row activation requests or representations thereof may be stored in storage logic such as bank/row activate command queues 102. The outputs of command queues 102 may be coupled to a bank/row command selector 104. Bank/row command selector 104 may choose from among the unexecuted bank/row activation commands available from queues 102, and may present its choices serially to a DRAM controller 106 for execution.

In general, for each bank/row activation request processed by DRAM controller 106, numerous bank/column commands would typically also be processed. For example, a bank/row activation request may be executed to open a page of memory, and then numerous bank/column commands may be executed by DRAM controller 106 using a burst read operation or a burst write operation within the newly-opened page. A bank/column command selector (not shown) may be used in conjunction with system 100 to accomplish this purpose. In an example embodiment, plural unexecuted bank/column commands may be made available to the bank/column command processor at any given point in time. In such an embodiment, the bank/column command processor may be designed to simply follow the output of bank/row command selector 104 in selecting which of the available bank/column commands to send to DRAM controller 106 for execution.

Because bank/column commands and bank/row commands may be consumed at different rates, however, a buffer such as synchronization FIFO buffer 114 may be used to handle data flow between bank/row command selector 104 and the bank/column command selector. In an example embodiment, as bank/row command selector 104 presents each bank/row activation request to DRAM controller 106 for execution, a token representing the request may also be placed in synchronization FIFO buffer 114. For further details regarding such a bank/column command processor and such a synchronization FIFO 114, the reader is referred to copending U.S. patent application Ser. No. 09/562,600, filed Apr. 29, 2000 and titled "Modified Aggressive Precharge DRAM Controller," which patent application is hereby incorporated by reference in its entirety.

Separate bank/row command queues (labeled in the drawing as stream 0 FIFO to stream n FIFO), may be provided for implementations wherein plural streams of memory access requests are being generated: As a first example, multiple processes within a host computer system may vie for access to a single unified memory system. In such a system, each of the request streams 0-n may correspond to one or more of the separate processes vying for memory access. As a second example, multiple processes or operations within a computer graphics subsystem may vie for access to a unified frame buffer memory wherein pixel, z and texture data are stored. In such a graphics subsystem, a display process and a DRAM refresh process must share memory bandwidth with other processes that manipulate the pixel, z and texture data. The bank/row activation requests corresponding to those processes or operations may be divided into separate streams 0-n and stored in stream FIFOs as shown at 102 or in other kind of queues.

In general, a controller 108 and a multiplexer 110 may be used to implement bank/row command selector 104. Multiplexer 110 may have its inputs coupled to the outputs of command queues 102 as shown, and its bank/row command output 111 coupled to DRAM controller 106. Controller 108 may have inputs coupled to the outputs of command queues 102 or to gated versions thereof. Controller 108 may provide a valid bit 214 to indicate to DRAM controller 106 when the output of multiplexer 110 is valid. A row match bit generator 112, along with check row compare information 113, may be used by bank/row command selector 104 to enhance memory bandwidth efficiency in a manner that will be described in more detail below.

Figure 2:
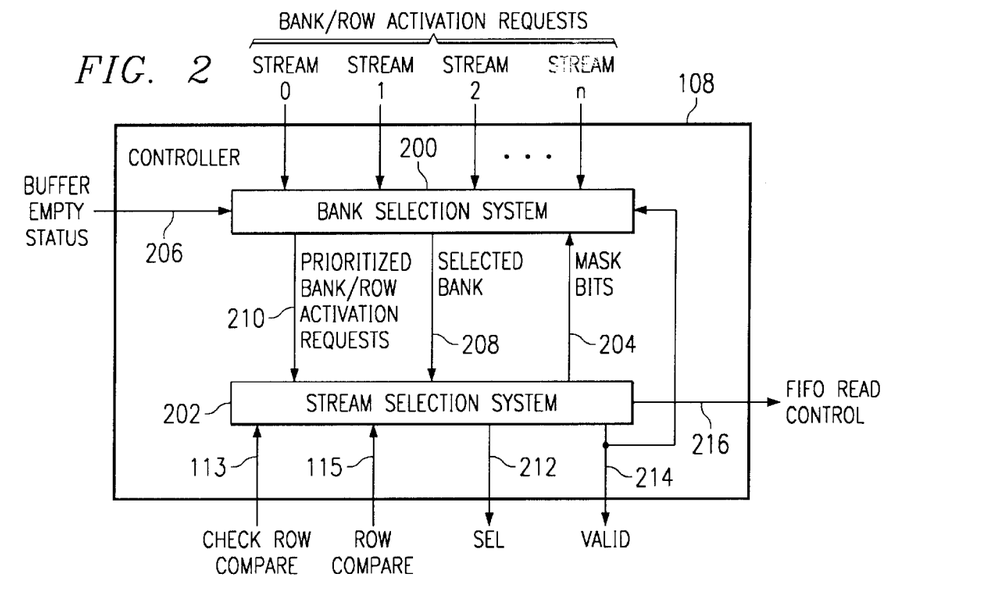
FIG. 2 is a block diagram illustrating the controller of FIG. 1 in more detail.

FIG. 2 illustrates an example embodiment of controller 108 in more detail. Controller 108 may include a bank selection system 200 and a stream selection system 202. Bank selection system 200 has inputs coupled to the outputs of command queues 102 (or gated versions thereof), designated in the drawings as streams 0-n. Bank selection system 200 also has inputs for mask bits 204, and inputs for monitoring the empty status 206 of synchronization buffer 114. Preferably, bank selection system 200 chooses one of the multiple banks of the memory system to be the target of a next bank/row activation request and presents its choice (selected bank 208) to stream selection system 202. It may also present a prioritized version of the multiple bank/row activation requests (prioritized bank/row activation requests 210) to stream selection system 202 in order to aid stream selection system 202 in choosing between the streams. Stream selection system 202 chooses an unexecuted bank/row activation request from among the streams for execution. It provides multiplexer select outputs 212, a valid output 214, and FIFO read control outputs 216 in order implement its choices. It may use check row compare information 113 and row compare bit 115 to enhance the quality of its choices.

Figure 3:
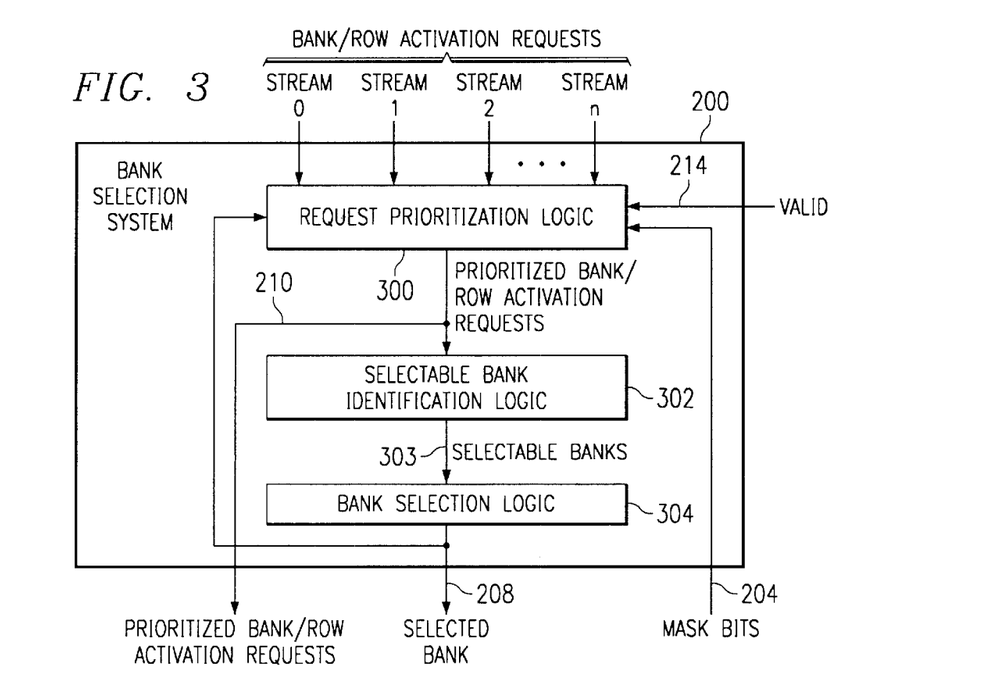
FIG. 3 is a block diagram illustrating the bank selection system of FIG. 2 in more detail.

FIG. 3 provides a more detailed view of an embodiment of bank selection system 200. Request prioritization logic 300 takes bank/row activation requests from streams 0-n and mask bits 204 as inputs and produces prioritized bank/row activation requests 210 as outputs. Selectable bank identification logic 302 takes prioritized bank/row activation requests 210 as inputs and determines from this information which of the banks of the memory system are selectable. (Preferably, the set of selectable banks will be the logical union of all banks that correspond to the unexecuted bank/row activation requests currently being presented by the unmasked streams.) The set of selectable banks 303 is indicated by the output of selectable bank identification logic 302. Bank selection logic 304 uses this information to select one bank of the memory system (selected bank 208) to be the target of a next bank/row activation request.

Figure 4:
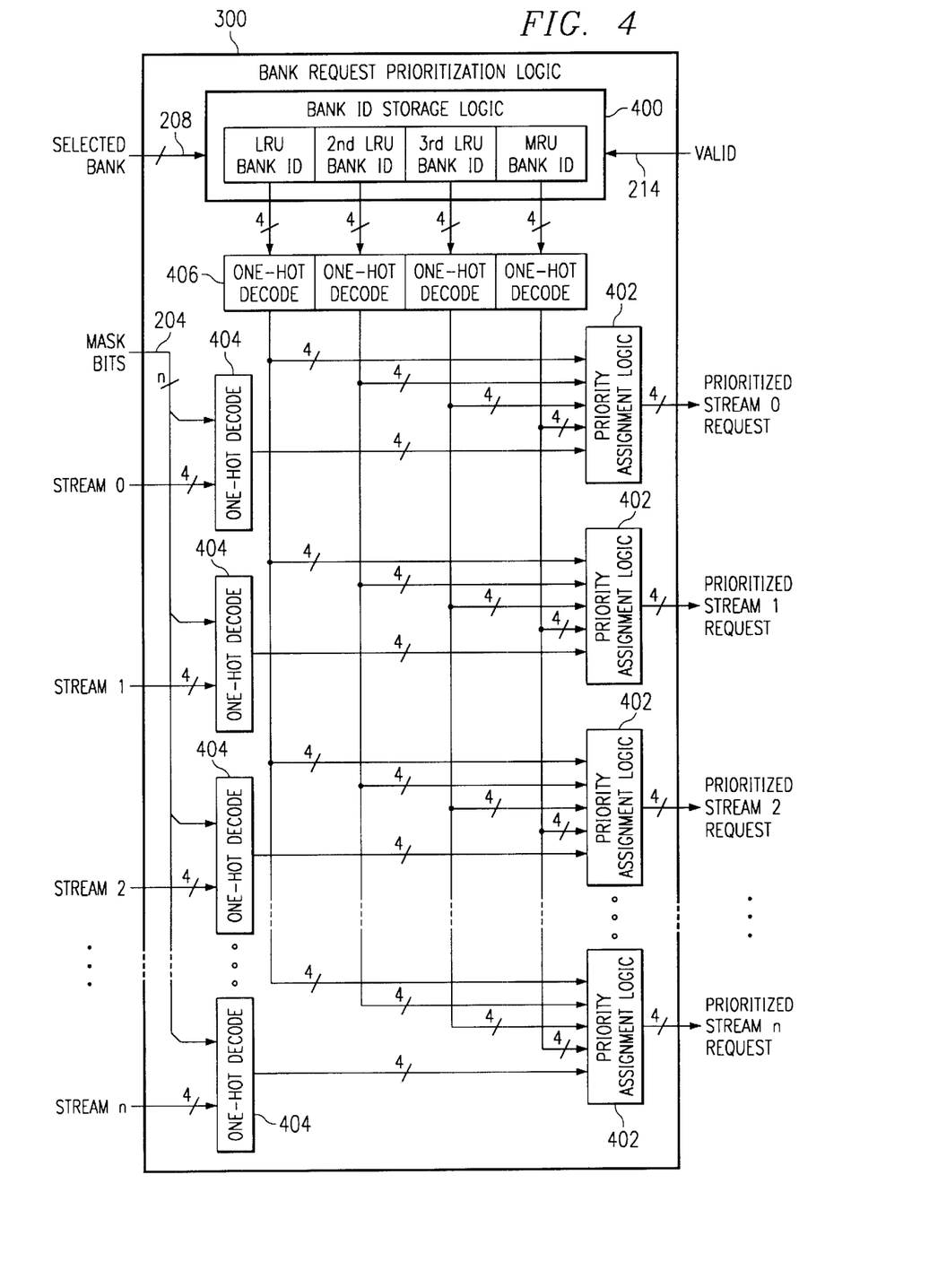
FIG. 4 is a block diagram illustrating the bank request prioritization logic of FIG. 3 in more detail.

FIG. 4 presents an embodiment of bank request prioritization logic 300 in more detail. Bank ID storage logic 400 may be used to keep track of the recency of use for each of the banks of the memory system. Using selected bank bits 208 and valid bit 214 as input information, bank ID storage logic 400 continually updates an ordered list of bank IDs from the least recently used (LRU bank ID) to the most recently used (MRU bank ID). It should be noted that the terms "most recently used" and "least recently used" may refer to the bank most or least recently activated, or they may refer to the bank most or least recently selected for activation. This is so because, in some embodiments, bank/row activation commands may be placed in a command buffer before they are executed: The last bank/row activation command placed in such a command buffer would identify the bank most recently selected for activation even though the selected bank has not yet been activated.

The ordered list of bank IDs can be used to prioritize the bank/row activation requests associated with the streams. One way of doing this, as shown, is to provide one set of priority assignment logic 402 per stream. Gated one-hot decoders 404 are used to optionally suppress bank/row activation requests from individual streams according to the state of the corresponding mask bits 204. And one-hot decoders 406 are used to create one-hot versions of the ordered bank IDs. Each priority assignment logic 402 has inputs coupled to all four decoded bank IDs and to the decoded bank portion of a bank/row activation request from one of the streams. The outputs of priority assignment logics 402 represent the prioritized bank/row activation requests 210 (one set per stream).

Figure 5:
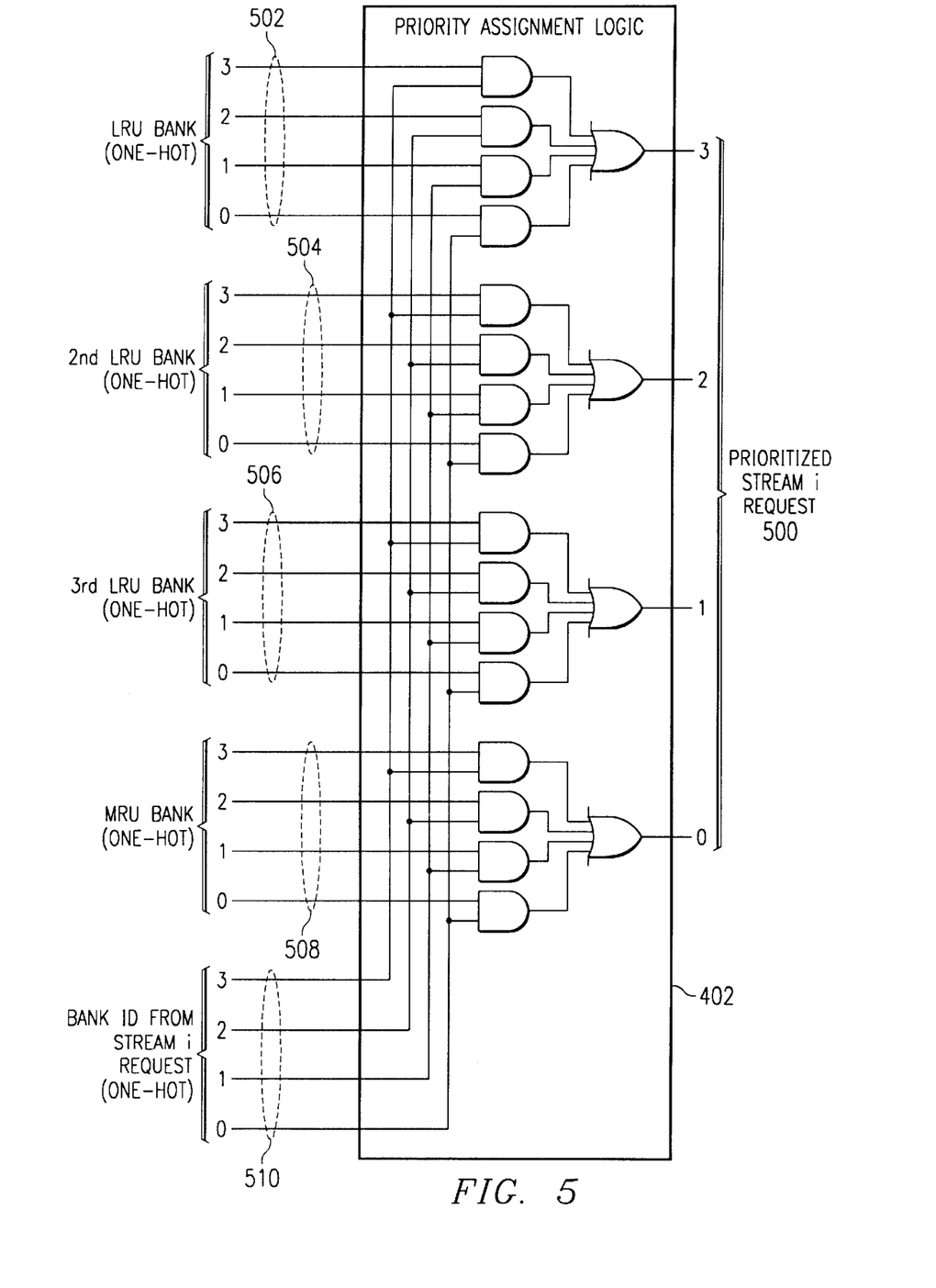
FIG. 5 is a block diagram illustrating an exemplary one of the priority assignment logics of FIG. 4 in more detail.

FIG. 5 suggests one implementation for a priority assignment logic 402. Each bit of a prioritized stream i request 500 is simply the logical OR of the bit-wise AND between a one-hot bank ID 502-508 and the bank ID that corresponds to a stream i request 510 (also one-hot). Thus, each prioritized stream i request will indicate whether that stream is requesting the LRU bank, the 2nd LRU bank, the 3rd LRU bank, or the MRU bank. Presenting the requested bank information in this manner for each stream helps to simplify the job of stream selection, to be discussed in more detail below.

Figure 6:
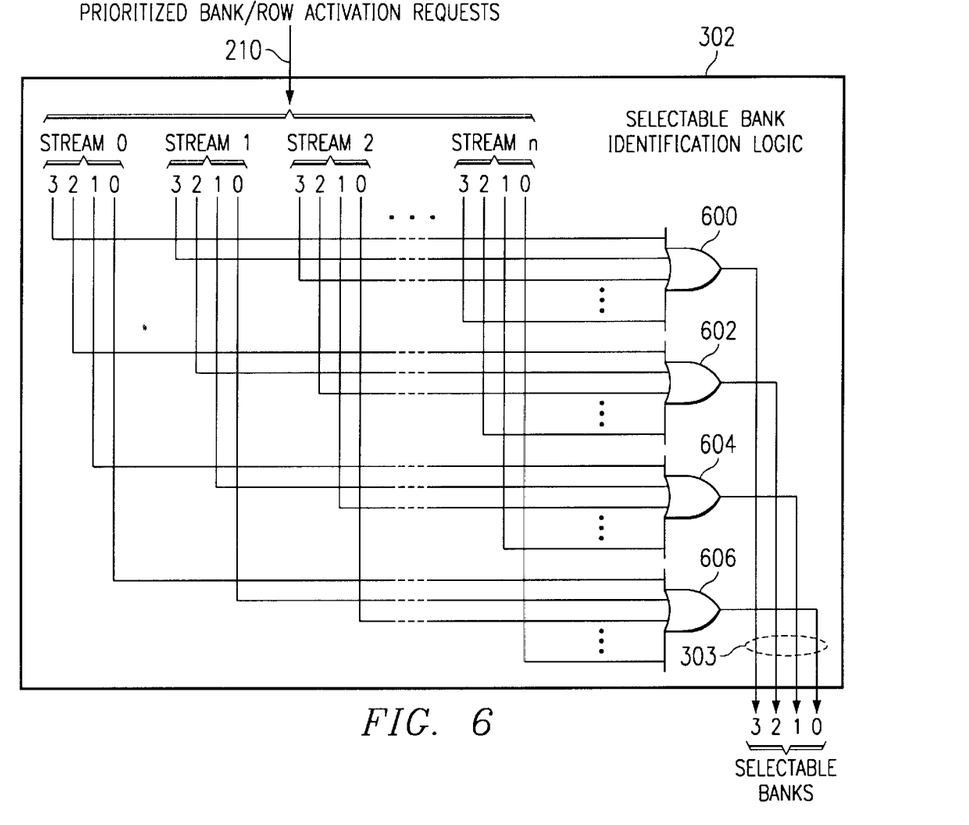
FIG. 6 is a block diagram illustrating the selectable bank identification logic of FIG. 3 in more detail.

FIG. 6 suggests one implementation for selectable bank identification logic 302. As was mentioned above, the set of selectable banks may be the logical union of the banks that correspond to the unexecuted bank/row activation requests currently being presented by the unmasked streams. Thus, one multi-input OR gate is provided for each bank. For all streams, prioritized request bit 3 is tied to OR gate 600, bit 2 to OR gate 602, bit 1 to OR gate 604, and bit 0 to OR gate 606. The outputs of OR gates 600–606 represent the set of selectable banks 303.

Bank Selection. Bank selection logic 304 uses selectable bank bits 303 as inputs and chooses one of the selectable banks to be the target of the next bank/row activation request. The choice, once made, is indicated on selected bank bits 208.

The inventors hereof have determined that, under certain circumstances, efficiencies can be created by choosing the most recently used bank: Sequential same-bank activation requests are ideal if they happen to be directed to the same page (bank/row) of memory. This is so because a single activate/precharge pair may be used to accommodate both accesses to the page. Whereas, if the two accesses are directed to different pages, then two separate pairs of activate/precharge commands are required to execute them. One embodiment of the invention was implemented in a modified aggressive precharge memory controller like the one described in copending U.S. patent application Ser. No. 09/562,600, supra. In such a system, the just-described efficiency requires not only that sequential activation requests be directed to the same bank/row, but also that they be closely spaced to one another in time so that the second access request may be detected before a precharge command is issued in connection with the first access. Therefore, bank selection logic 304 was designed to choose the most recently used bank (if selectable) whenever synchronization FIFO 114 is non-empty. If synchronization FIFO 114 is non-empty, then choosing the most recently used bank will not only cause sequential same-bank activation requests, but will also cause those requests to be spaced close enough in time for the modified aggressive precharge controller to notice the second request prior to issuing a precharge command in association with the first request. It should be noted that in implementations having a bank/row command buffer as described above, the empty status of the bank/row command buffer could be checked in lieu of the empty status of synchronization FIFO 114. (Any buffer whose consumption is related to burst activity could be checked with similar effect.)

Note that choosing the most recently used bank as the next bank provides only the possibility of placing two same-page access requests in sequence with one another: Once the most recently used bank has been chosen, it will be up to stream selection system 202 to find an unexecuted bank/row activation request corresponding to the chosen bank whose target row is the same as that of the immediately preceding request. This latter aspect of the invention will be discussed in more detail below.

If synchronization FIFO 114 is empty, or if the most recently used bank is not selectable, then preferably bank selection logic 304 should choose the least recently used selectable bank.

Figure 7:
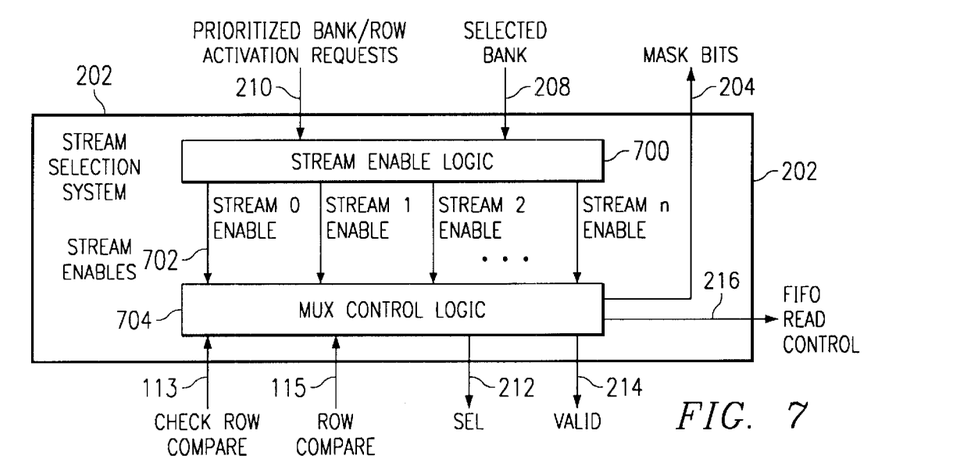
FIG. 7 is a block diagram illustrating the stream selection system of FIG. 2 in more detail.

Selection of Bank/Row Activation Requests. FIG. 7 illustrates an embodiment of stream selection system 202 in more detail. Stream enable logic 700 uses selected bank bits 208 and prioritized bank/row activation requests 210 to determine which streams are currently presenting a bank/row activation request that corresponds to the selected bank. It then asserts stream enable bits 702 accordingly.

Figure 8:
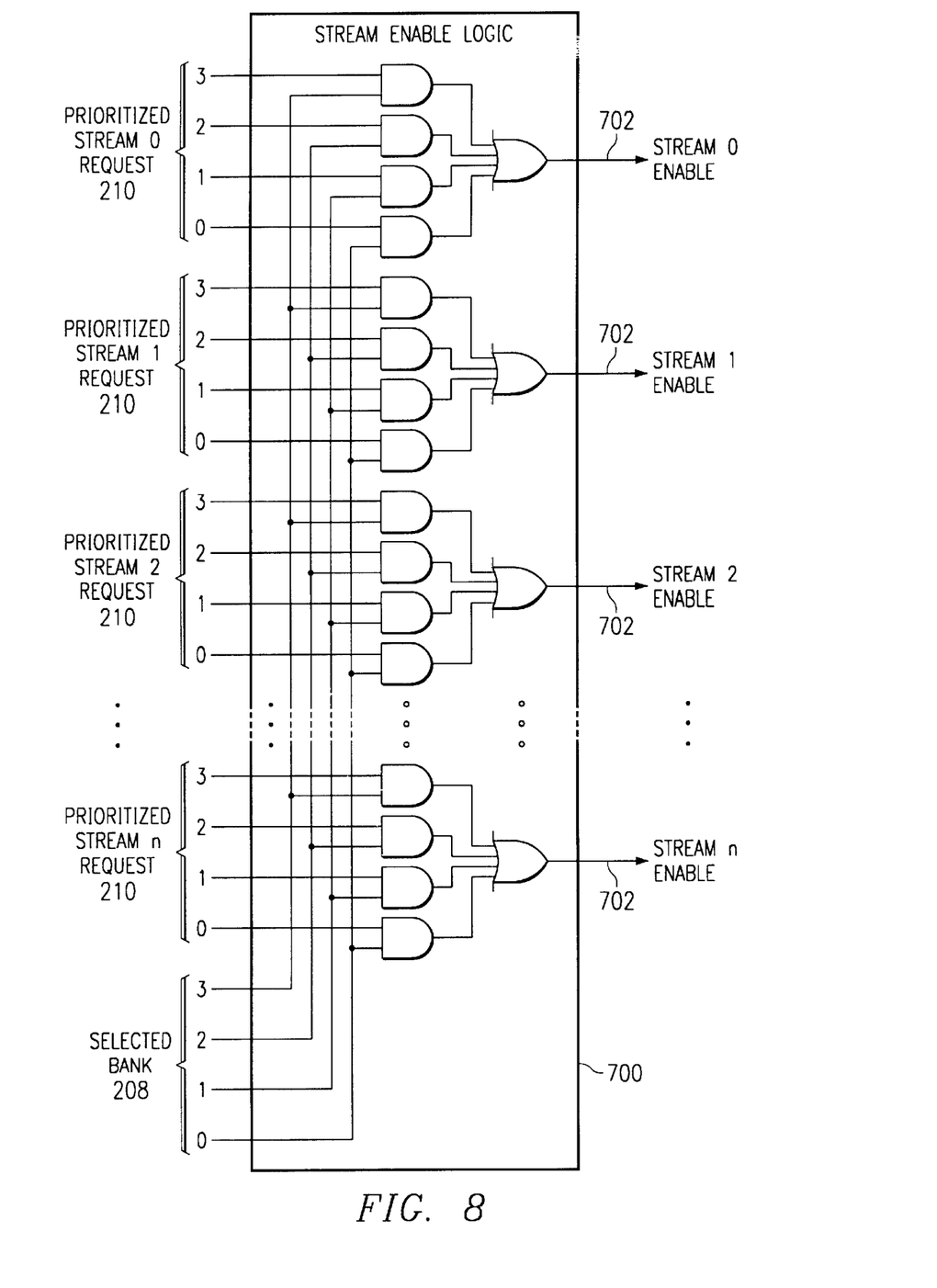
FIG. 8 is a block diagram illustrating the stream enable logic of FIG. 7 in more detail.

FIG. 8 suggests one implementation for stream enable logic 700. For each stream, the bit-wise AND may be determined between selected bank bits 208 and the four bank bits of the prioritized stream request 210. The four one-bit results may then be OR'd to produce a stream enable bit 702 for that stream, as shown.

Referring briefly back to FIG. 1, row match bit generator 112 is a system that stores the identity of the most recently activated row for each of the banks of the memory system. For a given bank/row activation request on bus 111 specifying a target bank and target row, row match bit generator asserts or unasserts row compare bit 115 to indicate whether the target row of the request on bus 111 is the same as the most recently activated row of the target bank.

Referring now back to FIG. 7, multiplexer ("MUX") control logic 704 chooses which unexecuted bank/row activation request should be issued for execution by DRAM controller 106. If check row compare information 113 indicates that burst activity is still occurring in the chosen bank, then control logic 704 will try to select a request whose target row matches the currently active row in the chosen bank. To do so, control logic 704 may iteratively select (using select bits 212) enabled streams one at a time at the output of multiplexer 110. On each iteration, control logic 704 checks the output of row match bit generator 112 using row compare bit 115. If a match is not found, the mask bit for the just-tried stream is asserted and another stream is tried. If a match is found, control logic 704 asserts valid bit 214 to indicate to DRAM controller 106 that the request on bus 111 is now issued for execution, and control logic 704 uses read control lines 216 to adjust command queues 102 accordingly. If check row compare information 113 indicates that burst activity has ceased or is about to cease, then mask bits 204 may be cleared to reset the selection process. After the selection process has been reset, it preferably begins again by re-executing the bank selection. This may result in a new bank being selected. Alternatively, the procedure may simply resume with bank/row command selection using the previously-chosen bank as the selected bank.

Under some circumstances, a selection may be made without regard to row match information. For example, if row compare information 113 indicates that burst activity has ceased or is about to cease, then searching for a row match might not be rewarded with bandwidth conservation. In such circumstances, control logic 704 may choose the bank/row activation request from a highest priority source: For example, in a computer graphics system, streams 0-n might correspond to display unit memory requests, memory refresh requests, texture mapping requests, z-buffer requests, and pixel data requests, respectively. In such a system, control logic 704 may be designed to favor the sources of memory access requests in the order just recited or in some other suitable order. Thus, when a matching row cannot be found or when no burst activity is still occurring in the chosen bank, the stream chosen for execution would be the highest priority enabled stream according to some predetermined ranking of the sources that correspond to the streams.

What is claimed is:

1. A method of controlling access to a DRAM memory system having multiple banks, comprising:

storing plural unexecuted bank/row activation requests, or representations thereof, in queues;

according to first criteria, choosing one of the multiple banks of the memory system to be the target of a next bank/row activation request;

according to second criteria, and from the queues, choosing an unexecuted bank/row activation request that corresponds to the chosen bank; and issuing the chosen bank/row activation request as the next bank/row activation request.

2. The method of claim 1, wherein choosing according to the first criteria comprises:

designating a bank corresponding to a most recently issued bank/row activation request as a most recently targeted bank;

determining whether the next bank/row activation request, if directed to the most recently targeted bank, will likely be processed before a precharge command is issued in relation to the most recently issued bank/row activation request; and if so, choosing the most recently targeted bank to be the target of the next bank/row activation request.

3. The method of claim 2, further comprising:

if it is determined that the next bank/row activation request, if directed to the most recently targeted bank, will not likely be processed before a precharge command is issued in relation to the most recently issued bank/row activation request, choosing the least recently targeted bank to be the target of the next bank/row activation request.

4. The method of claim 2, wherein:

the determining step comprises checking whether a buffer of issued bank/row activation requests is empty.

5. The method of claim 4, further comprising:

if the buffer is nonempty, concluding that the next bank/row activation request, if directed to the most recently targeted bank, will likely be processed before a precharge command is issued in relation to the most recently issued bank/row activation request.

6. The method of claim 1, wherein choosing according to the first criteria comprises:

choosing the least recently targeted bank.

7. The method of claim 1, wherein choosing according to the second criteria comprises:

identifying a highest priority unexecuted bank/row activation request from among plural unexecuted bank/row activation requests; and choosing the highest priority unexecuted bank/row activation request.

8. The method of claim 7, wherein:

plural sources generate the plural unexecuted bank/row activation requests; and identifying the highest priority unexecuted bank/row activation request comprises ranking the plural unexecuted bank/row activation requests according to the identity of the sources that generated them.

9. The method of claim 8, wherein:

ranking the plural unexecuted bank/row activation requests comprises following a predetermined static ranking of the plural sources.

10. A method of controlling access to a DRAM memory system having multiple banks, comprising:

a) from a set of unexecuted bank/row activation requests, conditionally choosing one request for execution;

b) determining whether the conditionally chosen request corresponds to a most recently selected row within the bank corresponding to the conditionally chosen request; and c) if so, presenting the conditionally chosen request for execution;

d) but if not, removing the conditionally chosen request from the set and beginning again at step a).

11. The method of claim 10, wherein:

removing the conditionally chosen request from the set comprises changing the state of a mask bit corresponding to the conditionally chosen request.

12. The method of claim 10, further comprising:

determining whether it is likely that step c) can be performed before a pending burst access to the memory system has been completed; and if it is determined that step c) likely cannot be performed before the pending burst access to the memory system has been completed, restoring any previously-removed requests to the set.

13. The method of claim 12, wherein:

restoring any previously-removed requests to the set comprises clearing a set of mask bits corresponding to the set of unexecuted bank/row activation requests.

14. Apparatus for controlling access to a DRAM memory system having multiple banks, comprising:

storage logic for storing plural unexecuted bank/row activation requests;

a multiplexer having its data inputs coupled to data outputs of the storage logic;

a bank selection system operable to choose one of the multiple banks of the memory system to be the target of a next bank/row activation request; and a stream selection system operable to choose one of the unexecuted bank/row activation requests corresponding to the chosen bank and to select the chosen request at the output of the multiplexer.

15. The apparatus of claim 14, wherein:

the bank selection system comprises selectable bank identification logic operable to identify as selectable banks only those banks that correspond to at least one of the unexecuted bank/row activation requests.

16. The apparatus of claim 15, wherein:

the bank selection system chooses only selectable banks.

17. The apparatus of claim 15, wherein:

the bank selection system comprises request prioritization logic operable to rank the multiple banks of the memory system from a most recently used bank to a least recently used bank according to the recency of their having been chosen to be the target of a bank/row activation request.

18. The apparatus of claim 17, further comprising:

a buffer coupled to the output of the multiplexer; and wherein the bank selection system chooses the most recently used bank if the most recently used bank is selectable and if the buffer is nonempty.

19. The apparatus of claim 18, wherein:

the bank selection system chooses the least recently used selectable bank if the buffer is empty.

20. The apparatus of claim 15, wherein:

the bank selection system chooses the least recently used selectable bank.

21. The apparatus of claim 14, wherein:

plural sources generate unexecuted bank/row activation requests; and when a set of plural unexecuted bank/row activation requests corresponds to the chosen bank, the stream selection system is operable to choose one request from the set according to a predetermined prioritization of the plural sources.

22. The apparatus of claim 14, further comprising:

row compare logic operable to indicate, for a given bank/row activation request corresponding to a given bank and row, whether the given row matches a most recently targeted row of the given bank.

23. The apparatus of claim 22, further comprising:

multiplexer control logic coupled to the row compare logic and operable to conditionally choose bank/row activation requests until a matching request is found whose given row matches the most recently targeted row of the given bank.

24. Apparatus for controlling access to a DRAM memory system having multiple banks, comprising:

storage logic operable to store plural unexecuted bank/row activation requests; and selection logic having at least one input coupled to the storage logic and having an output for presenting bank/row activation requests for execution;

wherein the selection logic is operable: to conditionally choose a first one of the stored plural requests for possible execution; to determine whether the first conditionally chosen request meets certain criteria; and if so, to present the first conditionally chosen request for execution; but if not, to conditionally choose a second one of the stored plural requests for possible execution.

25. The apparatus of claim 24, further comprising:

mask logic coupled to the storage logic and the selection logic, the mask logic operable to mask individual ones of the plural stored requests from being conditionally chosen by the selection logic.

26. The apparatus of claim 25, wherein:

the selection logic uses the mask logic to mask the first conditionally chosen request when it determines that the first conditionally chosen request does not meet the certain criteria.

27. The apparatus of claim 24, wherein:

each of the plural unexecuted bank/row activation requests specifies a target bank of the memory system and a target row within the target bank; and row compare logic for indicating whether the first conditionally chosen request meets the certain criteria;

wherein the certain criteria comprise whether the target row of a given bank/row activation request corresponds to a most recently targeted row within the target bank.

28. A machine-readable storage or transmission medium containing code that, when executed by a computer, causes the computer to perform a method of controlling access to a DRAM memory system having multiple banks, the method comprising:

storing plural unexecuted bank/row activation requests, or representations thereof, in queues;

according to first criteria, choosing one of the multiple banks of the memory system to be the target of a next bank/row activation request;

according to second criteria, and from the queues, choosing an unexecuted bank/row activation request that corresponds to the chosen bank; and issuing the chosen bank/row activation request as the next bank/row activation request.

29. The machine-readable storage or transmission medium of claim 28, wherein choosing according to the first criteria comprises:

designating a bank corresponding to a most recently issued bank/row activation request as a most recently targeted bank;

determining whether the next bank/row activation request, if directed to the most recently targeted bank, will likely be processed before a precharge command is issued in relation to the most recently issued bank/row activation request; and if so, choosing the most recently targeted bank to be the target of the next bank/row activation request.

30. The machine-readable storage or transmission medium of claim 29, wherein the method further comprises:

if it is determined that the next bank/row activation request, if directed to the most recently targeted bank, will not likely be processed before a precharge command is issued in relation to the most recently issued bank/row activation request, choosing the least recently targeted bank to be the target of the next bank/row activation request.

31. The machine-readable storage or transmission medium of claim 29, wherein:

the determining step comprises checking whether a buffer of issued bank/row activation requests is empty.

32. The machine-readable storage or transmission medium of claim 31, wherein the method further comprises:

if the buffer is nonempty, concluding that the next bank/row activation request, if directed to the most recently targeted bank, will likely be processed before a precharge command is issued in relation to the most recently issued bank/row activation request.

33. The machine-readable storage or transmission medium of claim 28, wherein choosing according to the first criteria comprises:

choosing the least recently targeted bank.

34. The machine-readable storage or transmission medium of claim 28, wherein choosing according to the second criteria comprises:

identifying a highest priority unexecuted bank/row activation request from among plural unexecuted bank/row activation requests; and choosing the highest priority unexecuted bank/row activation request.

35. The machine-readable storage or transmission medium of claim 34, wherein:

plural sources generate the plural unexecuted bank/row activation requests; and identifying the highest priority unexecuted bank/row activation request comprises ranking the plural unexecuted bank/row activation requests according to the identity of the sources that generated them.

36. The machine-readable storage or transmission medium of claim 35, wherein:

ranking the plural unexecuted bank/row activation requests comprises following a predetermined static ranking of the plural sources.

37. A machine-readable storage or transmission medium containing code that, when executed by a computer, causes the computer to perform a method of controlling access to a DRAM memory system having multiple banks, the method comprising:

a) from a set of unexecuted bank/row activation requests, conditionally choosing one request for execution;

b) determining whether the conditionally chosen request corresponds to a most recently selected row within the bank corresponding to the conditionally chosen request; and c) if so, presenting the conditionally chosen request for execution;

d) but if not, removing the conditionally chosen request from the set and beginning again at step a).

38. The machine-readable storage or transmission medium of claim 37, wherein:

removing the conditionally chosen request from the set comprises changing the state of a mask bit corresponding to the conditionally chosen request.

39. The machine-readable storage or transmission medium of claim 37, wherein the method further comprises:

determining whether it is likely that step c) can be performed before a pending burst access to the memory system has been completed; and if it is determined that step c) likely cannot be performed before the pending burst access to the memory system has been completed, restoring any previously-removed requests to the set.

40. The machine-readable storage or transmission medium of claim 39, wherein:

restoring any previously-removed requests to the set comprises clearing a set of mask bits corresponding to the set of unexecuted bank/row activation requests.

* * * * *